United States Patent
Andric et al.

(10) Patent No.: US 8,498,117 B2
(45) Date of Patent: Jul. 30, 2013

(54) VARIABLE MOUNT VOLTAGE REGULATOR

(75) Inventors: Anthony Andric, Lockhart, TX (US); David L. Wigton, Leander, TX (US); Paul Devriendt, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 1217 days.

(21) Appl. No.: 11/560,481

(22) Filed: Nov. 16, 2006

(65) Prior Publication Data

US 2008/0117593 A1   May 22, 2008

(51) Int. Cl.
*H05K 7/20* (2006.01)

(52) U.S. Cl.
USPC ........... 361/719; 361/697; 361/704; 361/709; 361/715

(58) Field of Classification Search
USPC ................. 361/694–695, 697, 704, 709, 715, 361/719, 785, 787; 165/80.3, 104.33, 185; 174/16.3, 260; 439/485, 487
See application file for complete search history.

(56) References Cited

U.S. PATENT DOCUMENTS

| | | | | |
|---|---|---|---|---|
| 5,416,428 A * | 5/1995 | Swart | ............................. | 324/759 |
| 5,694,297 A * | 12/1997 | Smith et al. | ................... | 361/785 |
| 5,919,259 A * | 7/1999 | Dahl | ............................. | 713/300 |
| 5,938,769 A * | 8/1999 | Hu | ................................ | 713/300 |
| 6,176,709 B1 * | 1/2001 | Sonobe et al. | ................... | 439/69 |
| 6,356,448 B1 | 3/2002 | DiBene, II et al. | ............ | 361/721 |
| 6,452,113 B2 | 9/2002 | Dibene, II et al. | ............ | 174/260 |
| 6,556,455 B2 | 4/2003 | Dibene, II et al. | ............ | 361/785 |
| 6,845,013 B2 * | 1/2005 | Hartke et al. | ................. | 361/704 |
| 6,862,184 B2 * | 3/2005 | Shi et al. | ........................ | 361/719 |
| 6,879,489 B2 * | 4/2005 | Koertzen | ....................... | 361/704 |
| 6,979,784 B1 | 12/2005 | Duley | ............................ | 174/260 |
| 7,064,955 B2 | 6/2006 | Harris et al. | ................... | 361/695 |
| 7,068,515 B2 | 6/2006 | Harris et al. | ................... | 361/709 |
| 7,280,364 B2 * | 10/2007 | Harris et al. | ................... | 361/721 |
| 2002/0172022 A1 | 11/2002 | DiBene, II et al. | ........... | 361/761 |
| 2003/0002268 A1 | 1/2003 | Dibene, II et al. | ............ | 361/784 |
| 2003/0057548 A1 | 3/2003 | Hartke et al. | ................. | 257/718 |
| 2004/0027802 A1 * | 2/2004 | Duerbaum et al. | ........... | 361/688 |

OTHER PUBLICATIONS

Incep Technologies, Inc.; www.incep.com; Incep ZVRM™ Architecture; 2003; all pages.
Incep Technologies, Inc.; Power Direct™ Model: PDI THS Preliminary Release; 2001; p. 1.
Elcon Products; www.elconproducts.com; PowerDirect™ InLine Low Inductance Connector; Tyco Electronics Product Preview; 2002; pp. 1-2.
Primarion, Inc.; www.primarion.com; Primarion$^R$ PX3511 Discrete MOSFET Driver, Product Brief; PDB-3511-001B; Aug. 1, 2005; pp. 1-2.

* cited by examiner

*Primary Examiner* — Anatoly Vortman
(74) *Attorney, Agent, or Firm* — Timothy M. Honeycutt

(57) ABSTRACT

Various integrated circuit voltage regulation apparatus and methods of assembling the same are provided. In one aspect, an apparatus is provided that has a stack that includes a heat sink and a semiconductor chip. The semiconductor chip has a conductive heat transfer pathway to the heat sink. A voltage regulator member is electrically coupled to the semiconductor chip and coupled to the heat sink, but is not positioned in the stack.

16 Claims, 4 Drawing Sheets

VARIABLE MOUNT VOLTAGE REGULATOR

BACKGROUND OF THE INVENTION

1. Field of the Invention

This invention relates generally to semiconductor chip manufacturing, and more particularly to apparatus and methods of providing regulated voltage to semiconductor chips.

2. Description of the Related Art

Desktop computers, servers and related equipment frequently use a main circuit board or "motherboard" to house many types of internal electronic components. Such components include, for example, a central processing unit (CPU), one or more slots or sockets to receive various types of cards, various input/output ports and other devices. In addition to a CPU, one component that is commonly placed on the motherboard is a voltage regulator. A typical voltage regulator receives one or more input voltages from a system power supply and provides a regulated output voltage that is used by one or more components on the motherboard. In one example of a common operation by a conventional voltage regulator, a 12 volt power output from a system power supply is converted to a regulated low voltage output in the 0.3 to 3.3 volt range for use by a microprocessor.

Conventional voltage regulators normally consist of an integrated circuit that provides the voltage regulation function as well as one or more inductors and some additional logic, such as a field effect transistor, as necessary to facilitate the voltage regulation function. These various components are usually all positioned on the motherboard.

Although the placement of the voltage regulator on the motherboard is superficially attractive from a manufacturing standpoint, there are nevertheless several drawbacks associated with such an arrangement. To begin with, placing the voltage regulator on the motherboard takes up space which might otherwise be used for other components. In addition, the voltage regulator is a source of heat that is transferred to the motherboard, which can create certain reliability issues with regard to the life span of the motherboard. Many configurations of motherboards do not receive sufficient air flow from a CPU cooling fan that might otherwise provide adequate cooling of the voltage regulator heat load. In addition, the way in which the on-motherboard voltage regulator delivers power to the microprocessor creates certain issues with regard to manufacturing and cost. For example, conventional microprocessors may require several hundred pins, many of which are dedicated to providing a power and ground pathway between the microprocessor and the voltage regulator output. This relatively large number of pins dedicated to power and ground increases the cost of the microprocessor socket. Another problem associated with the conventional wiring between the onboard voltage regulator and the microprocessor is the fact that conventional motherboards must have relatively heavy copper layers in order to handle the current load of the microprocessor. Finally, conventional motherboards with dedicated onboard voltage regulators have relatively limited capacity to deal with voltage regulator upgrades that might be appropriate in circumstances where the power ratings of microprocessors increase. This latter factor is one of the principle reasons why motherboards tend to go out of date rather quickly.

One conventional alternative approach to an on-motherboard voltage regulator involved the use of a voltage regulator module designed to be positioned in between the microprocessor lid and an overlying heat sink. The module included a voltage regulator integrated circuit and an inductor as is commonly utilized in an on-motherboard voltage regulator as well as one or more connectors designed to provide an electrical pathway between the regulator module and contact pads on the substrate of the microprocessor package. This conventional system suffered from a couple of drawbacks. To begin with, the system involved the assembly of several components that required relatively precise vertical and horizontal alignment in order to function properly. This requirement for precise alignment could lead to installation and performance problems, particularly for inexperienced users. In addition, the fact that the voltage regulator module was inserted into the stack consisting of the heat sink and the underlying microprocessor package meant that the regulator would contribute heat to that stack that could easily overload the cooling capacity of the heat sink. Furthermore, the heat from the microprocessor itself could tend to degrade the life span of the regulator board due to the significant conductive heat transfer pathway from the microprocessor package.

The present invention is directed to overcoming or reducing the effects of one or more of the foregoing disadvantages.

SUMMARY OF THE INVENTION

In accordance with one aspect of the present invention, an apparatus is provided that has a stack that includes a heat sink and a semiconductor chip. The semiconductor chip has a conductive heat transfer pathway to the heat sink. A voltage regulator member is electrically coupled to the semiconductor chip and coupled to the heat sink, but is not positioned in the stack.

In accordance with another aspect of the present invention, an apparatus is provided that includes a heat sink that has a first side adapted to face towards a semiconductor chip and a second side and opposite side adapted to face towards a cooling fan. A semiconductor chip is provided that has a conductive heat transfer pathway to the first side of the heat sink. A voltage regulator card is electrically coupled to the semiconductor chip and coupled to the heat sink, but is not positioned proximate either the first side or the second side of the heat sink.

In accordance with another aspect of the present invention, an apparatus is provided that includes a mother board, a semiconductor chip coupled to the motherboard. A heat sink is provided that has a first side adapted to be face towards and provide a conductive heat transfer pathway to the semiconductor chip and a second side and opposite side. A cooling fan is positioned proximate the second side of the heat sink. A power supply is provided. A voltage regulator card is electrically coupled to the semiconductor chip and the power supply and coupled to the heat sink, but is not positioned proximate either the first side or the second side of the heat sink.

In accordance with another aspect of the present invention, a method of manufacturing is provided that includes assembling stack that has a heat sink and a semiconductor chip that has a conductive heat transfer pathway to the heat sink. A voltage regulator member is provided. The voltage regulator member is coupled to the heat sink without positioning the voltage regulator member in the stack. The voltage regulator member is electrically coupled to the semiconductor chip.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
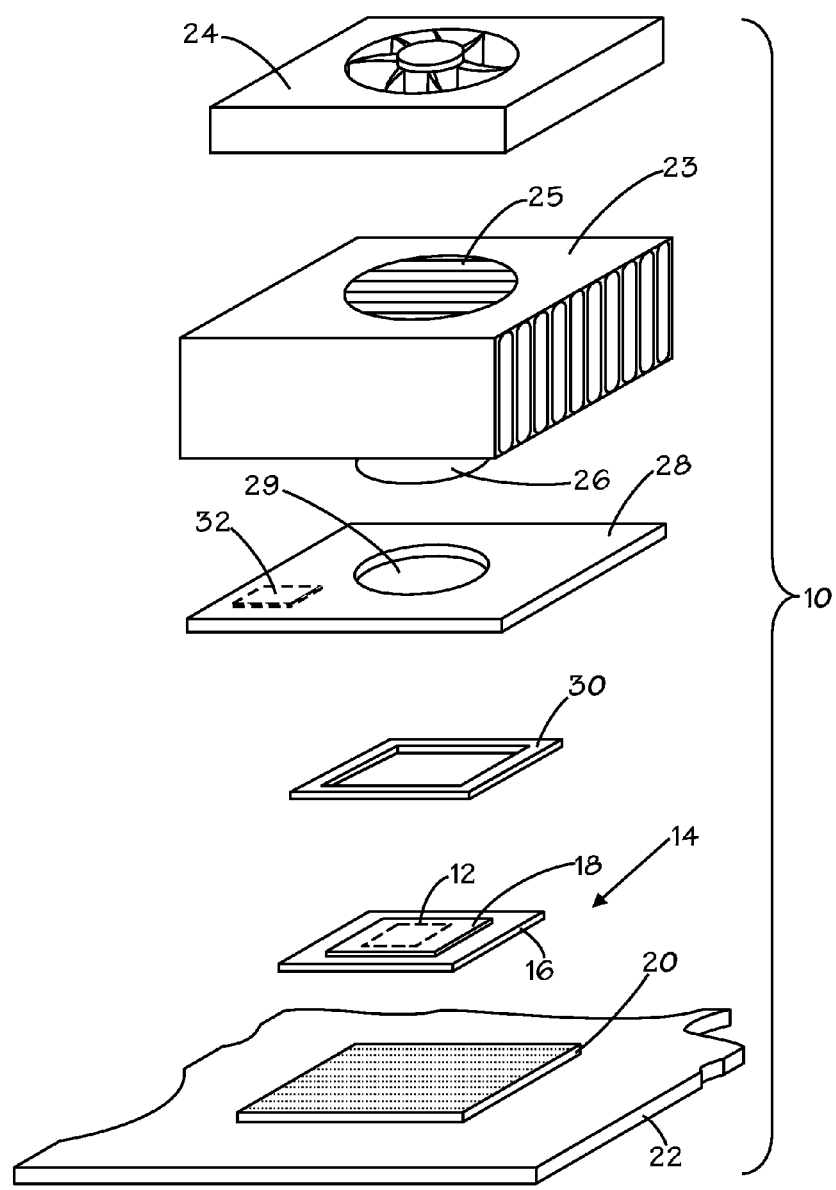
FIG. 1 is an exploded pictorial view of an exemplary conventional voltage regulation system for an integrated circuit.

In the drawings described below, reference numerals are generally repeated where identical elements appear in more than one figure. Turning now to the drawings, and in particular to FIG. 1, therein is shown an exploded pictorial view of an exemplary conventional voltage regulation system 10 for an integrated circuit 12. The integrated circuit 12 is enclosed within a package 14 that consists of a substrate 16 and an overlying package lid 18. The substrate 16 includes a plurality of downwardly facing conductor pins (not shown) that are designed to seat in a socket 20 that is positioned on a motherboard 22. Note that the motherboard 22 is of such size that only a portion thereof is depicted.

Cooling of the integrated circuit 12 is provided by way of a heat sink 23 and a cooling fan 24. The heat sink 23 includes an opening 25 to receive air flow from the fan 24 and a projection 26. In many conventional systems, the heat sink 23 and the overlying fan 24 would seat on the integrated circuit package lid 18. The projection 26 seats on the lid 18. However, in this conventional system 10, a voltage regulator module 28 and a rectangular connector 30 are interposed or sandwiched between the heat sink 23 and the underlying package 14. The voltage regulator module 28 includes an opening 29 to accommodate the projection 26 of the heat sink 23 and a regulator integrated circuit 32 (shown in phantom as it is positioned on the underside of the module 28). The integrated circuit 32 provides control of various other components (not shown) of the regulator 28. In order to establish electrical interconnect between the regulator module 28 and the integrated circuit package 14, an interconnect 30 shaped much like a picture frame is provided that is designed to connect electrically with external leads (not shown) of the package 14 and conductor pins (not shown) on the underside of the voltage regulator module 28.

As noted above in the Background section hereof, a conventional system, such as the type depicted in FIG. 1, while achieving certain advantages associated with moving the voltage regulator off the motherboard 22, nevertheless maintains the voltage regulator module 28 in the stack that includes the integrated circuit 14 and the overlying heat sink 23. The disadvantages of such an arrangement are described more fully in the Background section hereof.

Figure 2:
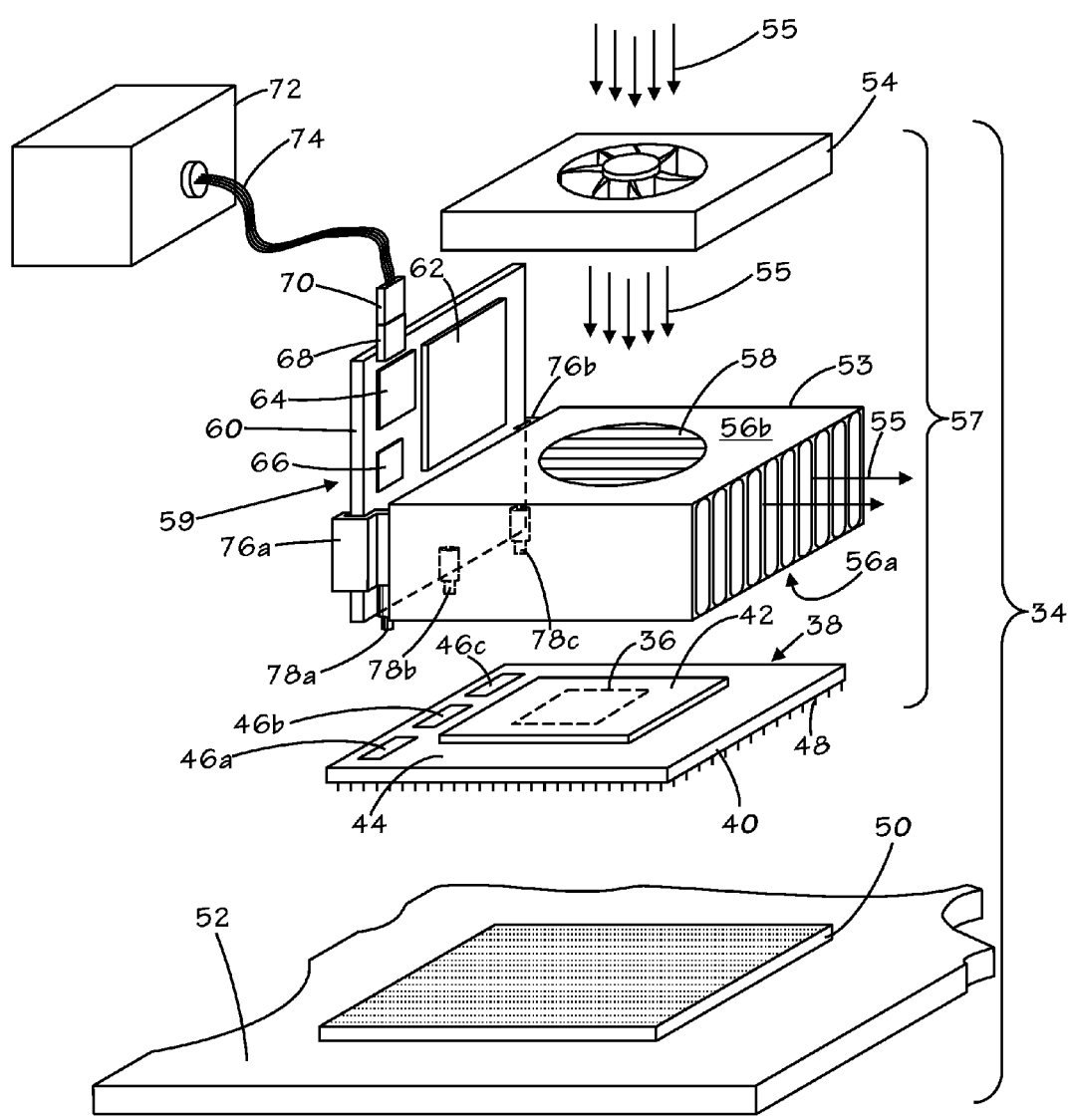
FIG. 2 is an exploded pictorial view of an exemplary embodiment of a voltage regulator system in accordance with aspects of the present invention.

Attention is now turned to FIG. 2, which is an exploded pictorial view of an exemplary embodiment of a voltage regulator system 34 in accordance with aspects of the present invention. The system 34 is designed to provide a regulated voltage or voltages to an integrated circuit 36, which may be a semiconductor chip, and possibly to other circuit devices. The system 34 may be used in a server, a desktop system or virtually any other computer or electronic system that might benefit from a voltage regulator and heat sink.

The integrated circuit 36 is enclosed within a package 38 and accordingly depicted in phantom. The package 38 may consist of an underlying substrate 40 and an overlying lid 42. The integrated circuit 36 may be any of a myriad of different types of circuit devices used in electronics, such as, for example, microprocessors, application specific integrated circuits, memory devices or the like. The substrate 40 may be composed of well-known plastics, ceramics, or other materials commonly used for integrated circuit packaging. The lid 42 may be composed of well-known plastics, ceramics or metallic materials as desired. A surface 44 of the substrate 40 is provided with one or more conductor traces or pads 46a, 46b and 46c. The pads 46a, 46b and 46c provide electrical interconnect pathways to and from the integrated circuit 36. The substrate 40 is provided with the plurality of conductor pins 48 that are designed to seat in respective sockets in the socket 50 positioned on a circuit or motherboard 52. Again, the motherboard 52 is of such size that only a portion thereof is depicted in FIG. 2. Connection methods other than pin-socket, such as soldering, may be used to electrically interconnect the substrate 40 with the motherboard 52.

Cooling of the integrated circuit 36 is provided by way of a heat sink 53 that is designed to be positioned on the package 38 and an optional cooling fan 54 that is designed to be positioned on, slightly above or to the side of the heat sink 53, and provide a flow of air 55. The heat sink 53 may take on a myriad of different shapes and configurations and be composed of metallic or non-metallic materials as desired. Metallic materials, such as copper and alloys thereof, tend to have relatively advantageous coefficients of conductive heat transfer. The heat sink 53 has side 56a that is designed to face towards and/or be seated on the package 38 and a side 56b that is designed to face towards and/or support the fan 54. The heat sink 53 and the package 38 are adapted to be arranged in a stack 57 that normally includes the fan 55. The stack 57 is depicted in a relatively vertical orientation. However, the skilled artisan will appreciate that the stack 57 may actually appear to be sideways or otherwise oriented in an actual enclosure (not shown). The heat sink 53 may be provided with an opening 58 to allow the air 55 to flow through the side 56b and exit laterally and it should be understood that the flow direction of the air 55 may be reversed if desired. The skilled artisan will appreciate that the heat sink 53 is designed to convey heat away from the integrated circuit 36. Accordingly, it should be understood that this may be accomplished by air cooling, liquid cooling or a combination of the two.

The system 34 includes a voltage regulator member 59 that is neither mounted directly on the motherboard 52 nor positioned in the stack 57 consisting of the heat sink 53 and the integrated circuit package 38. Instead, the voltage regulator 59 is coupled laterally to the heat sink 53.

It is envisioned that the voltage regulator member 59 can take on a variety of configurations, such as, for example, a board mounted configuration as depicted in FIG. 2, or a modular box-like configuration or some other form. In this exemplary embodiment, the voltage regulator 59 includes a card 60 upon which a voltage regulator integrated circuit 62 is mounted along with other components 64 and 66, which may consist of one or more inductors, capacitors, resistors or other logic necessary to provide a voltage regulation functionality. One or more switching transistors, such as a field effect transistors, are normally included. A few examples of chips that may serve as the integrated circuit 62 include the Intercell ISL 6559, or similar chips from Maxim, International Rectifier or Volterra. The voltage regulator 59 may provide a DC to DC step down or step up functionality or both. If desired, the regulator 59 may provide an AC to DC functionality.

The card 60 advantageously includes a power input connector 68 that is designed to interface with a connector 70 from a power supply 72 by way of a cord 74. The connector 68 and 70 may be well-known four-pin connectors commonly used in computer hardware or virtually any other type of electrical connectors suitable for transferring power. The power supply 72 typically, though not necessarily, converts AC to DC and may be housed within whatever enclosure houses the system 34 or may be external as desired.

The voltage regulator 59 may be coupled to the heat sink 53 in a myriad of different ways, such as bracket, clamps, or screw(s) to name just a few. In the illustrated embodiment, a pair of slide-in brackets 76a and 76b are coupled to the heat sink 53. The brackets 76a and 76b are advantageously shaped to conform to the general shape of the card 60 and are spaced apart sufficiently so that the card 60 may be slid downward in the brackets 76a and 76b so that one or more contact pins 78a, 78b or 78c (or other type of contact structure) of the card 60 may contact the respective pads 46a, 46b and 46c of the substrate 40. The brackets 76a and 76b may be sized to provide a slight interference fit with the card 60 so that card 60 is retained in position. Optionally, clips or brackets (not shown) could be used keep the card from upward movement. Note that the contact pins 78b and 78c are obscured by the heat sink 53 in FIG. 2 and thus are shown in phantom. The contact pins 78a, 78b and 78c provide electrical interconnects between the voltage regulator 59 and the integrated circuit 36 by way of the contact pads 46a, 46b and 46c. The number and spacing of the pins 78a, 78b and 78c is largely a matter of design discretion. For example, a single pin or plural pins may be used. The pins 78a, 78b and 78c may provide both power and ground pathways for the integrated circuit 36. Optionally, the pin 78a, 78b and 78c may provide power only and a ground pathway for the integrated circuit 36 may be provided by way of the socket 50 on the motherboard 52. The pins 78a, 78b and 78c may be coupled to the card by clamps, soldering or other well-known fastening techniques. One example of a commercially available type of spring biased pin is the Pylont Pogo supplied by Everett Charles Technologies.

The system 34 provides certain advantages over the conventional designs discussed elsewhere herein. To begin with, the voltage regulator 59 may be easily swapped in and out for upgrading or maintenance purposes by simply lifting the card 60 out through the brackets 78a and 78b and disconnecting from the power cord 74. This provides for easy upgrading and maintenance as necessary. In addition, since the voltage regulator 59 is removed from the stack 57, the problems associated with thermal loading to and from the voltage regulator 59 that is present in the conventional designs discussed elsewhere herein is alleviated. Furthermore, any flow of air 80 produced by the cooling fan 55 can readily flow past and provide cooling capability to the voltage regulator 59. This would also be true with regard to any air flow that may be provided by other cooling fans or air moving devices that may be housed within the same enclosure (not shown) that holds the system 34. One other advantage of course is the fact that the placement of the regulator 59 adjacent to the heat sink but not on the motherboard 52 frees up board space on the motherboard 52 that can be used for other components.

Figure 3:
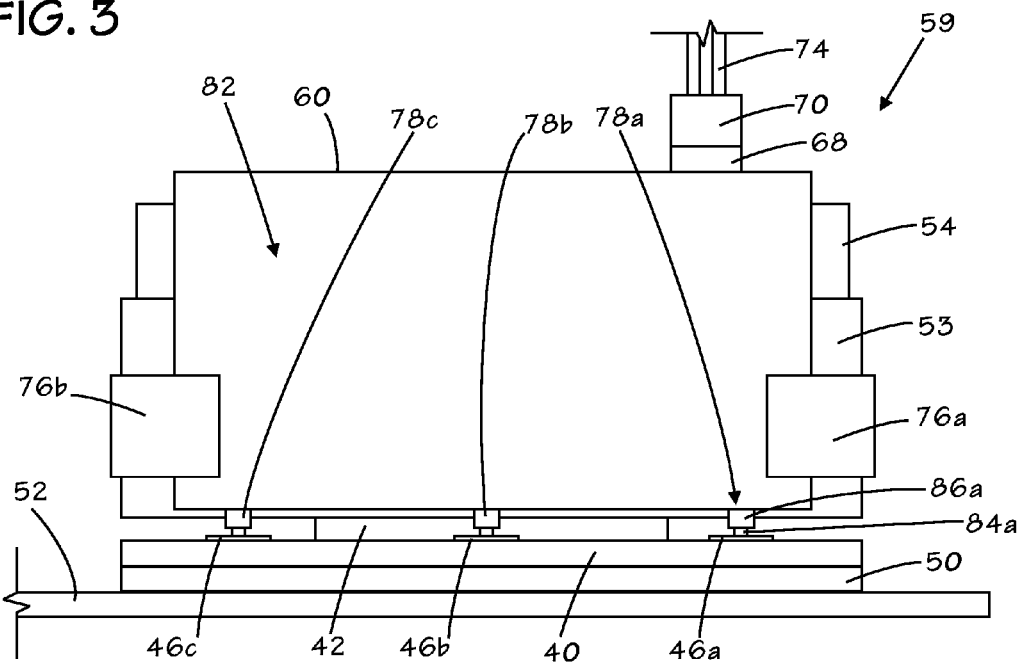
FIG. 3 is a side view of the system depicted in FIG. 2.
Figure 4:
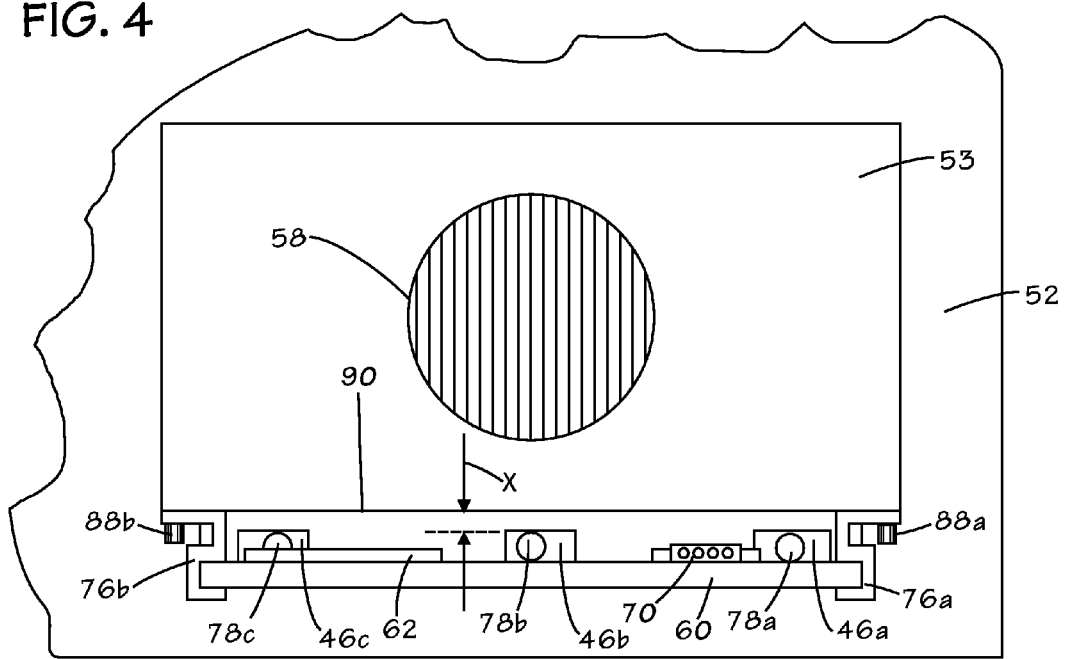
FIG. 4 is a top view of the system depicted in FIG. 2.

Additional detail regarding the system 34 may be understood by referring now to FIGS. 3 and 4. FIG. 3 is a side view of the system 34 that shows the backside 82 of the card 60 of the voltage regulator 59. Both of the slide-in brackets 76a and 76b are visible. However, the card 60 obscures much of the heat sink 53 and the cooling fan 55. Note also that only a portion of the power cord 74 is depicted for simplicity of illustration. Again the connector 70 of the power cord 74 is shown coupled to the corresponding connector 68 on the card 60. Here, unlike the exploded pictorial of FIG. 2, the system 34 is shown assembled such that the contact pins 78a, 78b and 78c are in contact with the respective contact pads 46a, 46b and 46c. It should be understood that the pins 78a, 78b and 78c are advantageously, though not necessarily, spring biased in that a given pin such as the pin 78a, consists of a contact shaft 84a that is slidedly and spring biased within an external housing 86a. Note also that the substrate 40 of the integrated circuit package 38 is connected to the socket 50 of the motherboard 52. In addition, the heat sink 53 is shown seated on the lid 42 of the integrated circuit package 38.

Attention is now turned to FIG. 4, which depicts the top view of the system shown in FIG. 3, albeit with the cooling fan 55 removed. Thus, the heat sink 53 is clearly visible. In this view, a portion of the regulator integrated circuit 62 is visible as well as the tops of the card 60 and the connector 70. The tops and a portion of the top of the connector pins 78a, 78b and 78c and the contact pads 46a, 46b and 46c are also visible. The slide in brackets 76a and 76b may be connected to the heat sink 53 by a myriad of mechanical fastening techniques. In this illustrative embodiment, screws 88a and 88b are used to attach the brackets 76a and 76b to the heat sink 53. However, virtually any mechanical fastening technique may be used. It is preferred that the brackets 76a and 76b be large enough to provide a gap X that establishes adequate clearance between the pins 78a, 78b and 78c and an edge 90 of the heat sink 53 so that the card 60 may be readily slipped downward in the brackets 76a and 76b so that the pins 78a, 78b and 78c do not contact the heat sink 53 and provide a possible short circuit.

Figure 5:
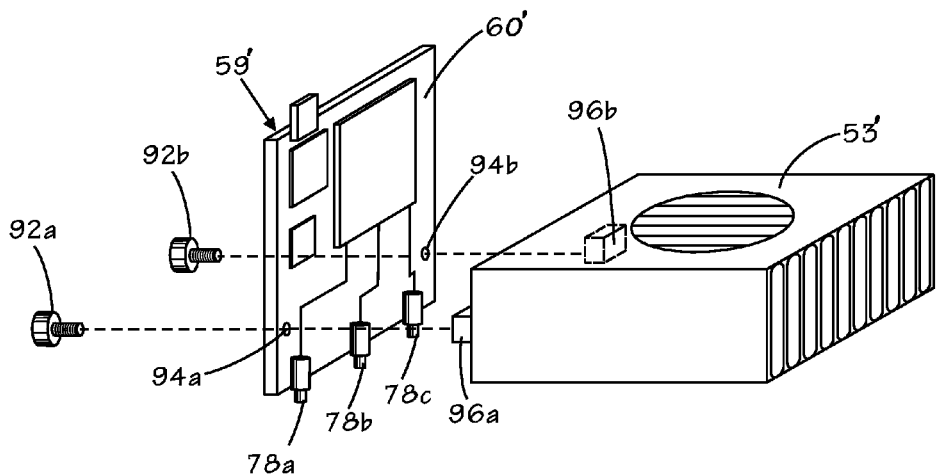
FIG. 5 is an exploded pictorial of an alternate exemplary embodiment of a voltage regulator system in accordance with aspects of the present invention.

As noted above, the voltage regulator 59 may be coupled to the heat sink 53 in a myriad of ways. FIG. 5 is an exploded pictorial of an alternate exemplary embodiment in which the voltage regulator, now designated 59', is coupled to the heat sink 53' by way of screws 92a and 92b that are designed to pass through respective bores 94a and 94b in the voltage regulator 59' and threadedly engage respective blocks 94a and 94b connected to the heat sink 53'. The block 96b is obscured by the heat sink 53' and is accordingly depicted in phantom. In this pictorial, the three conductor pins 78a, 78b and 78c are more clearly visible. The blocks 96a and 96b may be composed of the same types of material used to fabricate the heat sink 54' or of different materials as desired. More advantageous conductive heat transfer from the regulator 59' will be possible if the blocks 96a and 96b are formed of thermally conductive materials. In this embodiment, the use of the screws 92a and 92b to fasten the voltage regulator 59' to the heat sink 53' still provides an easily replaceable and upgradeable system.

Figure 6:
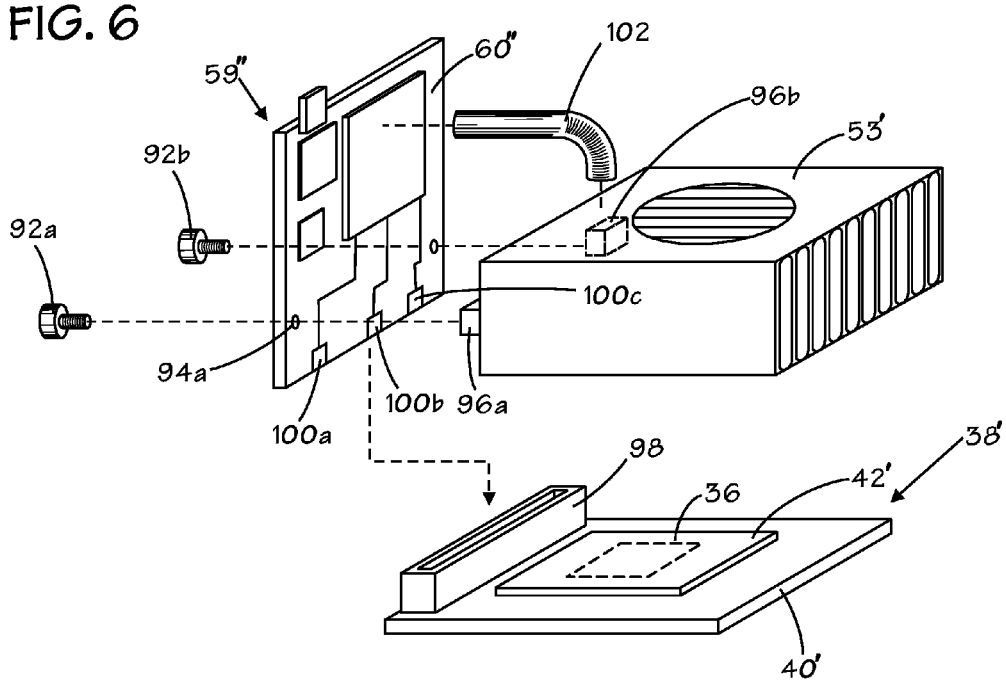
FIG. 6 is an exploded pictorial of another alternate exemplary embodiment of a voltage regulator system in accordance with aspects of the present invention.

In another alternate exemplary embodiment depicted in FIG. 6, the voltage regulator, now designated 59", is coupled to the heat sink 53' by way of the screws 92a and 92b and the connector blocks 96a and 96b. However, in this illustrative embodiment, the electrical interconnects between the regulator 59" and the integrated circuit 36 are provided in a different fashion. In this embodiment, the integrated circuit 36 is housed in a package 38' that consists of a substrate 40' and a package lid 42'. However, a socket 98 is provided on the substrate 401 that is designed to receive the card 60" of the voltage regulator 59'. In this regard, the card 60" is provided with one or more conductor pads 100a, 100b and 100c that will contact corresponding conductor members in the socket 98.

An option illustrated in FIG. 6, but equally applicable to the other embodiments described elsewhere herein, is the establishment of a conductive heat transfer pathway from the voltage regulator 59" to the heat sink 53'. In this example, a heat pipe 102, composed of a thermally conducting material, such as copper or other metals, is secured to a component of the voltage regulator 59" and to the heat sink 53'. Other types of thermally conducting structures may be used, and even thermal pastes could be used if the voltage regulator 59" is placed sufficiently close to the heat sink 53'.

It should also be understood that while the foregoing embodiments use pin-to-pad or pad-to-socket arrangements to establish electrical interconnects between the voltage regulators 59, 59' and 59" and their corresponding heat sinks 53 and 53', other types are envisioned, such as, for example pin-to-hole, hole-to-pin or an umbilical.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. An apparatus, comprising:
   a stack including a heat sink and a semiconductor chip coupled to a package substrate and having a conductive heat transfer pathway to the heat sink; and
   a voltage regulator member coupled to the heat sink but not being positioned in the stack and including at least one spring biased pin to contact the package substrate and electrically couple to the semiconductor chip.

2. An apparatus, comprising:
   a stack including a heat sink and a semiconductor chip coupled to a package substrate and having a conductive heat transfer pathway to the heat sink;
   a voltage regulator member coupled to the heat sink but not being positioned in the stack and including at least one pin to contact the package substrate and electrically couple to the semiconductor chip; and a power supply coupled to the voltage regulator member.

3. An apparatus, comprising:
   a heat sink having a first side and a second side and opposite side adapted to face towards a cooling fan;
   a semiconductor chip package having a semiconductor chip and a socket coupled to a side of a package substrate, the socket having an opening facing away from the side of the package substrate, the semiconductor chip having a conductive heat transfer pathway to the first side of the heat sink; and
   a voltage regulator card including a conductor adapted to be inserted into the socket to electrically couple to the semiconductor chip, the voltage regulator card being coupled to the heat sink but not being positioned proximate either the first side or the second side of the heat sink.

4. The apparatus of claim 3, wherein the voltage regulator card is coupled to the heat sink by a pair of brackets.

5. The apparatus of claim 3, wherein the voltage regulator card is coupled to the heat sink by at least two screws.

6. The apparatus of claim 3, wherein the semiconductor chip comprises a microprocessor.

7. The apparatus of claim 3, comprising a power supply coupled to the voltage regulator card.

8. The apparatus of claim 3, wherein the voltage regulator card comprises a DC to DC regulator.

9. The apparatus of claim 8, wherein the DC to DC regulator comprises a step-down regulator.

10. A method of manufacturing, comprising:
    assembling stack including a heat sink and a semiconductor chip coupled to a package substrate and having a conductive heat transfer pathway to the heat sink;
    providing a voltage regulator member having at least one spring biased pin; and
    coupling the voltage regulator member to the heat sink without positioning the voltage regulator member in the stack, and contacting the package substrate and electrically coupling the voltage regulator member to the semiconductor chip with the at least one spring biased pin.

11. A method of manufacturing, comprising:
    assembling stack including a heat sink and a semiconductor chip coupled to a package substrate and having a conductive heat transfer pathway to the heat sink;
    providing a voltage regulator member having at least one pin;
    coupling the voltage regulator member to the heat sink without positioning the voltage regulator member in the stack, and contacting the package substrate and electrically coupling the voltage regulator member to the semiconductor chip with the at least one pin; and coupling a power supply to the voltage regulator member.

12. A method of manufacturing, comprising:
    assembling a stack including a heat sink and a semiconductor chip package having a semiconductor chip and a socket coupled to a side of a package substrate, the socket having an opening facing away from the side of the package substrate, the semiconductor chip having a conductive heat transfer pathway to the heat sink;
    providing a voltage regulator member having at least one conductor; and
    coupling the voltage regulator member to the heat sink without positioning the voltage regulator member in the stack, and electrically coupling the voltage regulator member to the semiconductor chip by inserting the at least one conductor into the opening of the socket.

13. The method of claim 12, wherein the coupling of the voltage regulator member to the heat sink comprises using a pair of brackets coupled to the heat sink.

14. The method of claim 12, wherein the coupling of the voltage regulator member to the heat sink comprises using at least two screws.

15. The method of claim 12, wherein the semiconductor chip comprises a microprocessor.

16. The method of claim 12, comprising coupling a power supply to the voltage regulator member.

* * * * *